United States Patent [19]
Feng et al.

[11] Patent Number: 5,291,455
[45] Date of Patent: Mar. 1, 1994

[54] MEMORY HAVING DISTRIBUTED REFERENCE AND BIAS VOLTAGES

[75] Inventors: Taisheng Feng; John D. Porter; Jennifer Y. Chiao, all of Austin, Tex.

[73] Assignee: Motorola, Inc., Schaumburg, Ill.

[21] Appl. No.: 880,381

[22] Filed: May 8, 1992

[51] Int. Cl.[5] .............................................. G11C 5/14
[52] U.S. Cl. ...................................... 365/226; 365/63
[58] Field of Search ............... 307/296.4, 296.1, 296.6, 307/303.1; 257/786, 734; 365/52, 63, 226

[56] References Cited

U.S. PATENT DOCUMENTS 4,906,863  3/1990  Van Tran ........................ 307/296.7
5,001,362  3/1991  Tran ................................ 307/296.4

OTHER PUBLICATIONS

Blood, William R. Jr., "MECL System Design Handbook", Fourth Edition, 1988, pp. 93-101.

Primary Examiner—Eugene A. LaRoche
Assistant Examiner—Frank R. Niranjan
Attorney, Agent, or Firm—Daniel D. Hill

[57] ABSTRACT

A memory (20) has $N_{BIAS}$ generators (63 and 73) coupled to the positive and negative power supply lines (61 and 62) at a point close to amplifiers (84 and 85) and address buffers (76) to insure that they all receive the same power supply voltage to prevent an impact on the access times of memory (20). A $V_{CS}$ generator (65) is located close to power supply bonding pads (23 and 25) and to output buffers (77 and 78) to reduce the effects of power supply line noise on the noise margins. A $V_{AREF}$ generator provides a reference voltage to the differential amplifiers of address buffers (75 and 76). Locating $V_{AREF}$ generator (67) close to power supply bonding pads (23 and 25) insures that the reference voltage is always at the midpoint of the input logic swing.

16 Claims, 6 Drawing Sheets

1

MEMORY HAVING DISTRIBUTED REFERENCE AND BIAS VOLTAGES

FIELD OF THE INVENTION

This invention relates generally to memories, and more particularly, to BICMOS memories having reference and biasing circuits.

BACKGROUND OF THE INVENTION

Voltage reference circuits and biasing circuits of one form or another exist in many integrated circuits, and are especially common in large integrated circuit applications such as memories. In order to supply stable biasing and reference voltages, the power supply voltage must be stable and consistent throughout the integrated circuit memory. The power supply voltage is usually distributed across the integrated circuit by metal power supply lines, or conductors. As the length of these relatively thin metal lines increases, the resistance and capacitance between the connection point and the outside supply increases. The amount of voltage drop depends on the amount of current flowing through the conductor and the resistance of the conductor. In an integrated circuit memory the amount of current flow varies, causing voltage fluctuations at the demand end of the conductor. Normally, the voltage drop along a power supply conductor is reduced by making the metal lines of the power supply conductors as wide as possible. But there is a tradeoff between the width of the metal lines and integrated circuit size. Size constraints do not normally allow the metal lines to be wide enough to reduce the series resistance and capacitance enough to provide a power supply voltage adequate to guarantee proper operation of the integrated circuit at very high speeds.

The power supply lines can also be a source of noise on an integrated circuit memory. The noise immunity of an integrated circuit is commonly specified in terms of noise margins. Noise margins are usually given for worst case conditions, which includes the most unfavorable connections of the input terminals and the poorest combination of circuit and device parameters, along with a maximum fan-out. As the operating speed of an integrated circuit memory increases, the negative effects of noise or a voltage drop in the power supply increase. The more noise or voltage drop there is on the power supply lines, the smaller the range of variability allowed in the reference and bias voltages because the memory must operate within narrower margins.

The introduction of the so called revolutionary pinout technique has alleviated some of the problems with power distribution on integrated circuit memories by decreasing the power supply conductor lengths and increasing the number of power supply bonding pads and power supply pins. But increasing the size and density of the integrated circuit memory have correspondingly caused an increase in the length of the power supply conductors. Nevertheless, as higher speeds are demanded of integrated circuit memories, any power supply variations that interfere with system operation become intolerable. The biasing and reference voltage generation circuits must remain stable and must supply constant voltage levels in order to insure accurate system operation.

SUMMARY OF THE INVENTION

Accordingly, there is provided, in one form, a memory having distributed reference and biasing voltages. The memory comprises a plurality of bonding pads, a positive and a negative power supply voltage, a positive and a negative power supply voltage conductor, an amplifier, and a bias voltage generator. The plurality of bonding pads are located within a central portion, along a first edge of the memory, which are for conducting positive and negative power supply voltages. A first bonding pad of the plurality of bonding pads is for receiving the positive power supply voltage. A positive power supply voltage conductor runs substantially parallel to the first edge of the memory and has first and second ends. The positive power supply voltage conductor is coupled to the first bonding pad. A second bonding pad of the plurality of bonding pads is for receiving the negative power supply voltage. A negative power supply voltage conductor runs substantially parallel to the first edge of the memory and has first and second ends. The negative power supply voltage conductor is coupled to the second bonding pad. The amplifier is coupled to the first end of each of the positive and negative power supply voltage conductors, and provide first and second output signals having logic levels determined by steering a predetermined current in response to first and second input signals. The bias voltage generator is coupled to the first end of each of the positive and negative power supply voltage conductors and to the amplifier. The bias voltage generator provides a bias voltage to the amplifier. The predetermined current is proportional to the bias voltage. These and other features and advantages will be more clearly understood from the following detailed description taken in conjunction with the accompanying drawings.

DESCRIPTION OF THE PREFERRED EMBODIMENT

Figure 1:
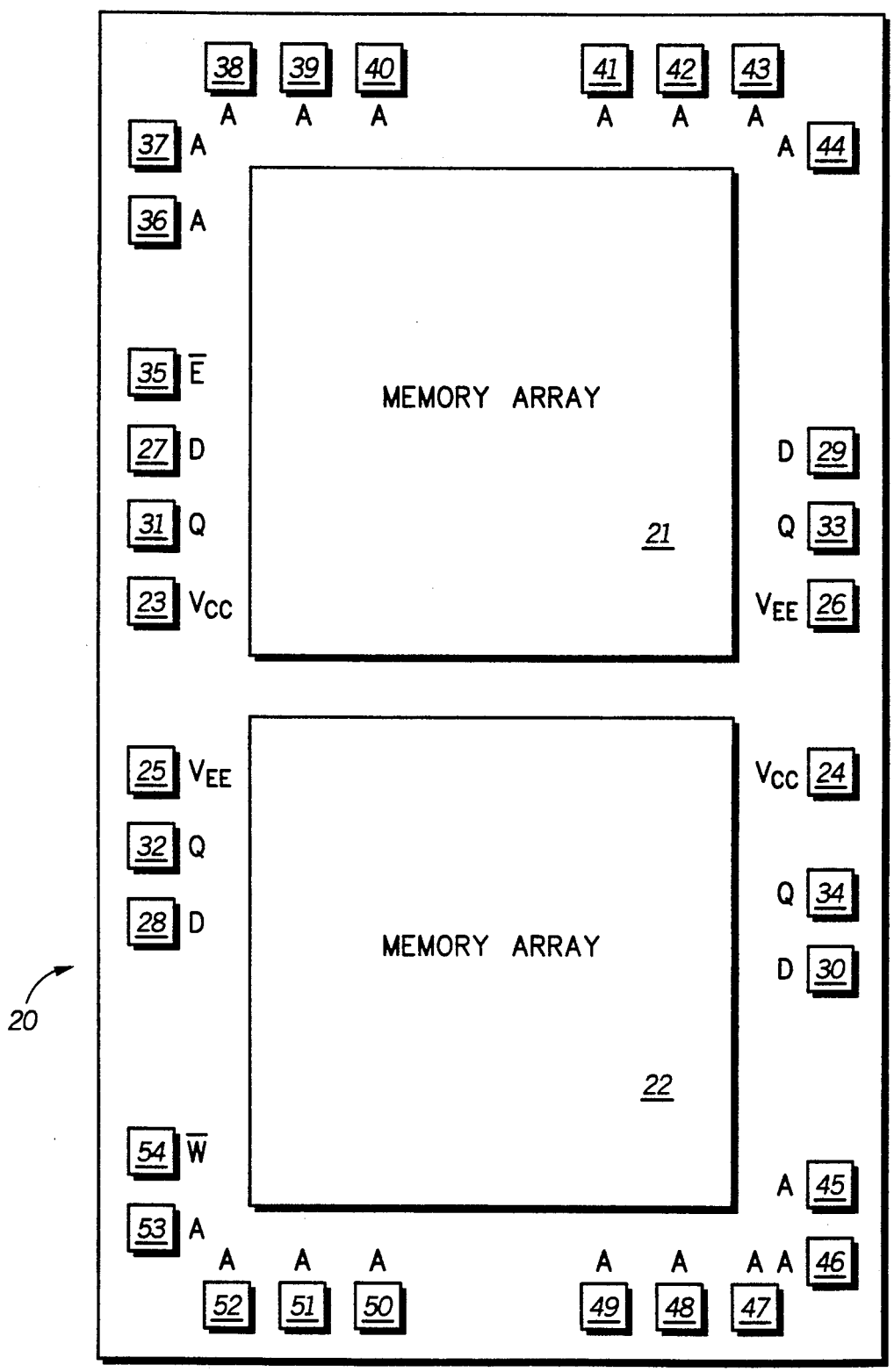
FIG. 1 illustrates a plan view of an integrated circuit memory utilizing a revolutionary pinout technique.

FIG. 1 illustrates a plan view of an integrated circuit memory 20 utilizing a revolutionary pinout technique. An integrated circuit memory utilizing the revolutionary pinout technique has power supply pins at the midpoint of each side of the integrated circuit, and address pins around each of the corners. The data in and data out pins are adjacent to the power supply pins. The revolutionary pinout technique provides the advantage of reduced inductance due to shortened leadframe paths. The additional $V_{CC}$ and $V_{EE}$ pins provides for shorter internal power supply conductors.

Memory 20 includes memory arrays 21 and 22, and bonding pads 23-54. Bonding pads 23-54 are connected to a leadframe (not shown), during the packaging process of integrated circuit memory 20. Bonding pads 23 and 24 are for receiving a positive power supply voltage labeled "$V_{CC}$" and bonding pads 25 and 26 are for receiving a negative power supply voltage labeled "$V_{EE}$". $V_{CC}$ is normally made to be the system ground and $V_{EE}$ is equal to $-5.2$ volts. However, $V_{CC}$ may be a positive 5 volts and $V_{EE}$ could be made to be the system ground. Data in bonding pads 27-30, labeled "D", are for providing data into memory 20 during a write cycle and data out bonding pads 31-34, labeled "Q", are for receiving date from memory 20 during a read cycle of memory 20. Bonding pad 35, labeled "E", is for enabling memory 20. Address bonding pads 36-53, labeled "A", are for receiving an address to allow a particular location in memory 20 to be accessed for either reading data from memory arrays 21 and 22 or writing data into memory arrays 21 and 22. The number of address bonding pads 36-53 is determined by the data organization, or word width, of memory 20. Shown in FIG. 1 are eighteen address bonding pads 36-53 to support a word width of X4. More or less address bonding pads may be necessary to support a different word width. Bonding pad 54, is for receiving a write enable control signal labeled "$\overline{W}$" for selecting whether data is to be read from, or written into memory 20. Note that for the purpose of simplicity, data in bonding pads 27-30 are all labeled "D", data out bonding pads 31-34 are all labeled "Q", and address bonding pads 36-53 are all labeled "A". It is not important to give each a specific name in order to understand the invention.

Figure 2:
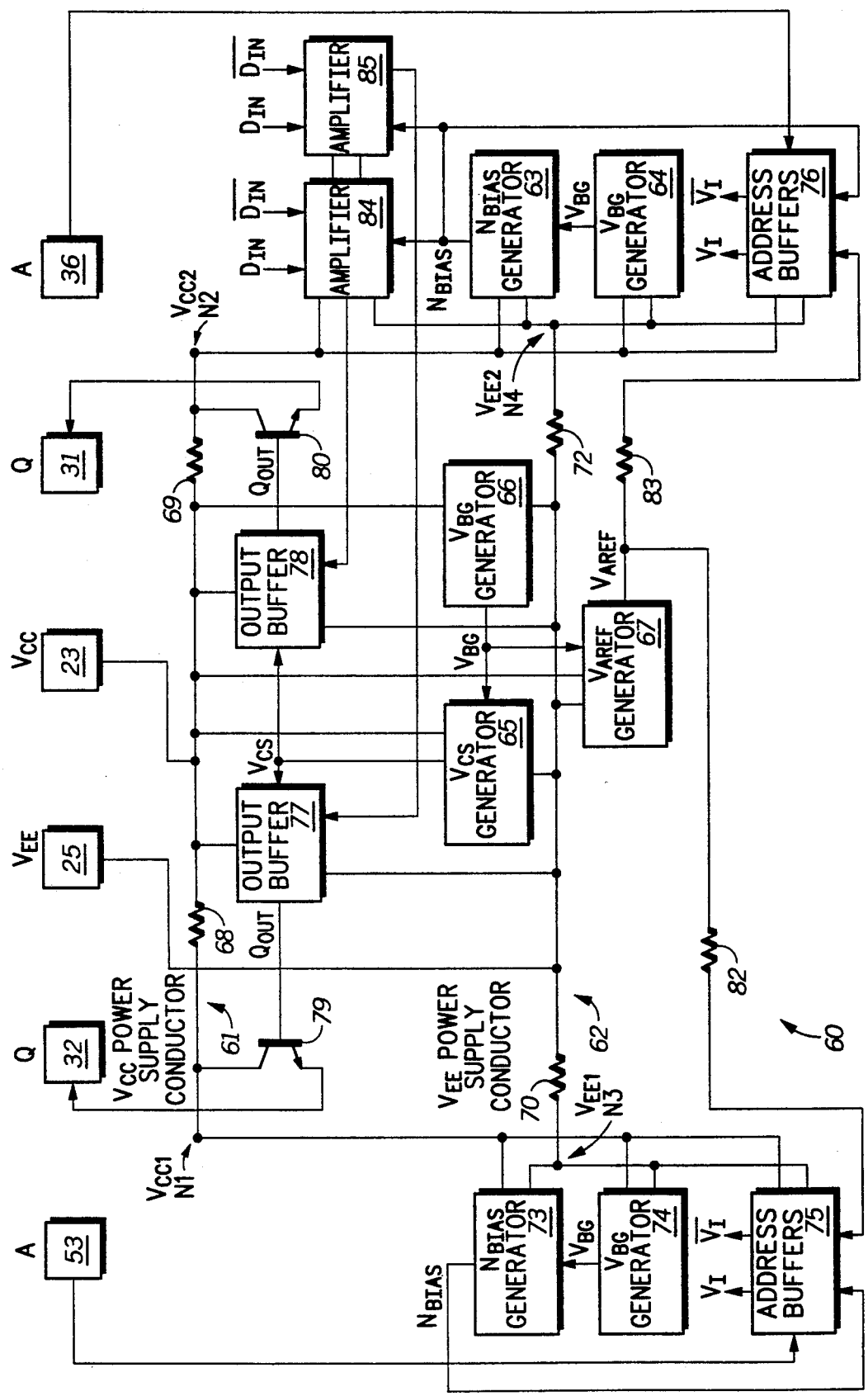
FIG. 2 illustrates in partial schematic form and partial block diagram form the memory of FIG. 1 using distributed reference voltage and bias voltage generators in accordance with the present invention.

FIG. 2 illustrates in partial schematic form and partial block diagram form memory 20 of FIG. 1 with distributed reference voltage and bias voltage generators 60 in accordance with the present invention. In order to illustrate the approximate relative locations of distributed reference voltage and bias voltage generators 60, their corresponding bonding pads are also shown in FIG. 2. Note, however, that FIG. 2 is not drawn to scale. Distributed reference voltage and bias voltage generators 60 includes $N_{BIAS}$ generators 63 and 73, $V_{BG}$ generators 64, 66, and 74, a $V_{CS}$ generator 65, and a $V_{AREF}$ generator 67. Also shown in FIG. 2 are a $V_{CC}$ power supply conductor 61, a $V_{EE}$ power supply conductor 62, address buffers 75 and 76, data output buffers 77 and 78, NPN transistors 79 and 80, and amplifiers 84 and 85. Additional distributed reference voltage and bias voltage generators, identical to distributed reference voltage and bias voltage generators 60, are located on the opposite side of memory 20 of FIG. 1 and located relative to the remaining bonding pads in the same way as distributed reference voltage and bias voltage generators 60 of FIG. 2.

Resistor 68 represents the inherent parasitic resistance of $V_{CC}$ power supply conductor 61 between $V_{CC}$ bonding pad 23 and a node labeled "N1". Resistor 69 represents the inherent parasitic resistance of $V_{CC}$ power supply conductor 62 between $V_{CC}$ bonding pad 23 and a node labeled "N2". Resistor 70 represents the inherent parasitic resistance of $V_{EE}$ power supply conductor 62 between $V_{EE}$ bonding pad 25 and a node labeled "N3". Resistor 72 represents the inherent parasitic resistance of $V_{EE}$ power supply conductor 62 between $V_{EE}$ bonding pad 25 and a node labeled "N4". The voltage at node N1, labeled "$V_{CC1}$", is equal to $V_{CC}-I_{68}R_{68}$, where $R_{68}$ is the resistance of resistor 68 and $I_{68}$ represents the current through $R_{68}$. The product $I_{68}R_{68}$ represents the voltage drop between $V_{CC}$ bonding pad 23 and node N1. The voltage at node N2, labeled "$V_{CC2}$", is equal to $V_{CC}-I_{69}R_{69}$, where $R_{69}$ is the resistance of resistor 69 and $I_{69}$ is the current through $R_{69}$. For a given current, as the length of the conductor increases the difference between $V_{CC}$ and $V_{CC1}$, and $V_{CC}$ and $V_{CC2}$ increases. $V_{EE}$ power supply conductor 62 suffers from a voltage drop along its length due to parasitic resistance represented by resistors 70 and 72. Voltage $V_{EE1}$ at node N3 is equal to $V_{EE}-I_{70}R_{70}$, where $R_{70}$ is the resistance of resistor 70 and $I_{70}$ is equal to the current through $R_{70}$. Similarly, voltage $V_{EE2}$ at node N4 is equal to $V_{EE}-I_{72}R_{72}$, where $R_{72}$ is the parasitic resistance of resistor 72 and $I_{72}$ is equal to the current through $R_{72}$. Note that $V_{EE1}$ and $V_{EE2}$ are more positive than $V_{EE}$ because $I_{70}$ and $I_{72}$ are negative currents. The current flowing through $V_{CC}$ power supply conductor 61 and $V_{EE}$ power supply conductor 62 varies depending on the demands of the many circuits being supplied by the power supply conductors.

The parasitic resistance of a conductor on an integrated circuit is equal to $pL/W$ where $p$ is the sheet resistivity of the metal layer of the conductor, L is the length of the conductor, and W is the width of the conductor. The longer the conductor, the larger the parasitic resistance of the conductor for a given width. The voltage drop along a power supply conductor caused by a parasitic resistance can be substantial. For example, referring to $V_{CC}$ power supply conductor 61, if L=1800 microns, W=30 microns, and $p=0.05$ ohms per square, then $R_{68}=3$ ohms. If $I_{68}=30$ mA, then $I_{68}R_{68}=30\times3=90$ mV. At ECL or TTL logic levels, a 90 mV drop in the power supply voltage can cause a significant reduction in noise immunity. Any voltage drop on a power supply conductor causes a direct loss in noise immunity and should be avoided.

Still referring to FIG. 2, $N_{BIAS}$ generator 63 is connected to $V_{CC}$ power supply conductor 61 at node N2 and to $V_{EE}$ power supply conductor 62 at node N4 for receiving $V_{CC2}$ and $V_{EE2}$, respectively. $V_{BG}$ generator 64 is also connected to $V_{CC}$ power supply conductor 61 at node N2 and to $V_{EE}$ power supply conductor 62 at node N4 for receiving $V_{CC2}$ and $V_{EE2}$, respectively. $V_{BG}$ generator 64 provides a bandgap reference voltage to $N_{BIAS}$ generator 63. In turn, $N_{BIAS}$ generator 63 provides a DC bias voltage to address buffers 76 and to amplifiers 84 and 85. Likewise, on the other end of the power supply conductors, $N_{BIAS}$ generator 73 is connected to $V_{CC}$ power supply conductor 61 at node N1 and to $V_{EE}$ power supply conductor 62 at node N3 for receiving $V_{CC1}$ and $V_{EE1}$, respectively. $V_{BG}$ generator 74 is connected to $V_{CC}$ power supply conductor 61 at node N1 and to $V_{EE}$ power supply conductor 62 at node N3 for receiving $V_{CC1}$ and $V_{EE1}$ respectively. $V_{BG}$ generator 74 provides a bandgap reference voltage to $N_{BIAS}$ generator 73. $N_{BIAS}$ generator 73 provides a DC bias voltage to address buffers 75.

Amplifiers 84 and 85 can also be located on the other side of memory 20 and coupled to $V_{CC}$ power supply conductor 61 at node N1 and to $V_{EE}$ power supply conductor 62 at node N3 and receive voltage $N_{BIAS}$ from $N_{BIAS}$ generator 73. Another option would be to locate one amplifier on one side of memory 20 and the other amplifier on the other side of memory 20.

$V_{CS}$ generator 65 is connected to $V_{CC}$ power supply conductor 61 near $V_{CC}$ bonding pad 23 and to $V_{EE}$ power supply conductor 62 near $V_{EE}$ bonding pad 25 for receiving power supply voltages $V_{CC}$ and $V_{EE}$ in order to minimize the voltage drop on $V_{CC}$ power supply conductor 61 and $V_{EE}$ power supply conductor 62 caused by parasitic resistance as represented by parasitic resistances 68, 69, 70, and 72. Any voltage drop caused by parasitic resistances can reduce the noise margin. $V_{CS}$ generator 65 receives a bandgap reference voltage labeled "$V_{BG}$", from $V_{BG}$ generator 66 and provides a DC bias voltage labeled "$V_{CS}$" to output buffers 77 and 78. Locating output buffers 77 and 78, $V_{CS}$ generator 65, and $V_{BG}$ generator 66 close to $V_{CC}$ bonding pad 23 and $V_{EE}$ bonding pad 25 reduces any voltage drop caused by parasitic resistance on $V_{CC}$ power supply conductor 61 and $V_{EE}$ power supply conductor 62. Output transistor 79 has a collector connected to $V_{CC}$ power supply conductor 61, a base connected to output buffer 77 for receiving a signal labeled "$Q_{OUT}$", and an emitter connected to data out bonding pad 32. Output transistor 80 has a collector connected to $V_{CC}$ power supply conductor 61, a base connected to output buffer 78 for receiving a signal labeled "$\overline{Q_{OUT}}$", and an emitter connected to data out bonding pad 31.

$V_{AREF}$ generator 67 is connected to $V_{CC}$ power supply conductor 61 near $V_{CC}$ bonding pad 23 and to $V_{EE}$ power supply conductor 62 near $V_{EE}$ bonding pad 25 for receiving power supply voltages $V_{CC}$ and $V_{EE}$. $V_{AREF}$ is located close to the bonding pads to improve the $V_{IL(max)}/V_{IH(min)}$ margin. $V_{AREF}$ generator 67 receives a bandgap reference voltage ($V_{BG}$) from $V_{BG}$ generator 66 and provides a DC bias voltage labeled "$V_{AREF}$" to address buffers 75 and 76. Resistors 82 and 83 represent the parasitic resistance between $V_{AREF}$ generator 67 and address buffers 75 and 76.

Like noted above for FIG. 1, it is not important to give each signal and voltage a specific name in order to understand the invention. Therefore, for purposes of simplicity, like signals and voltages are given the same name.

Figure 3:
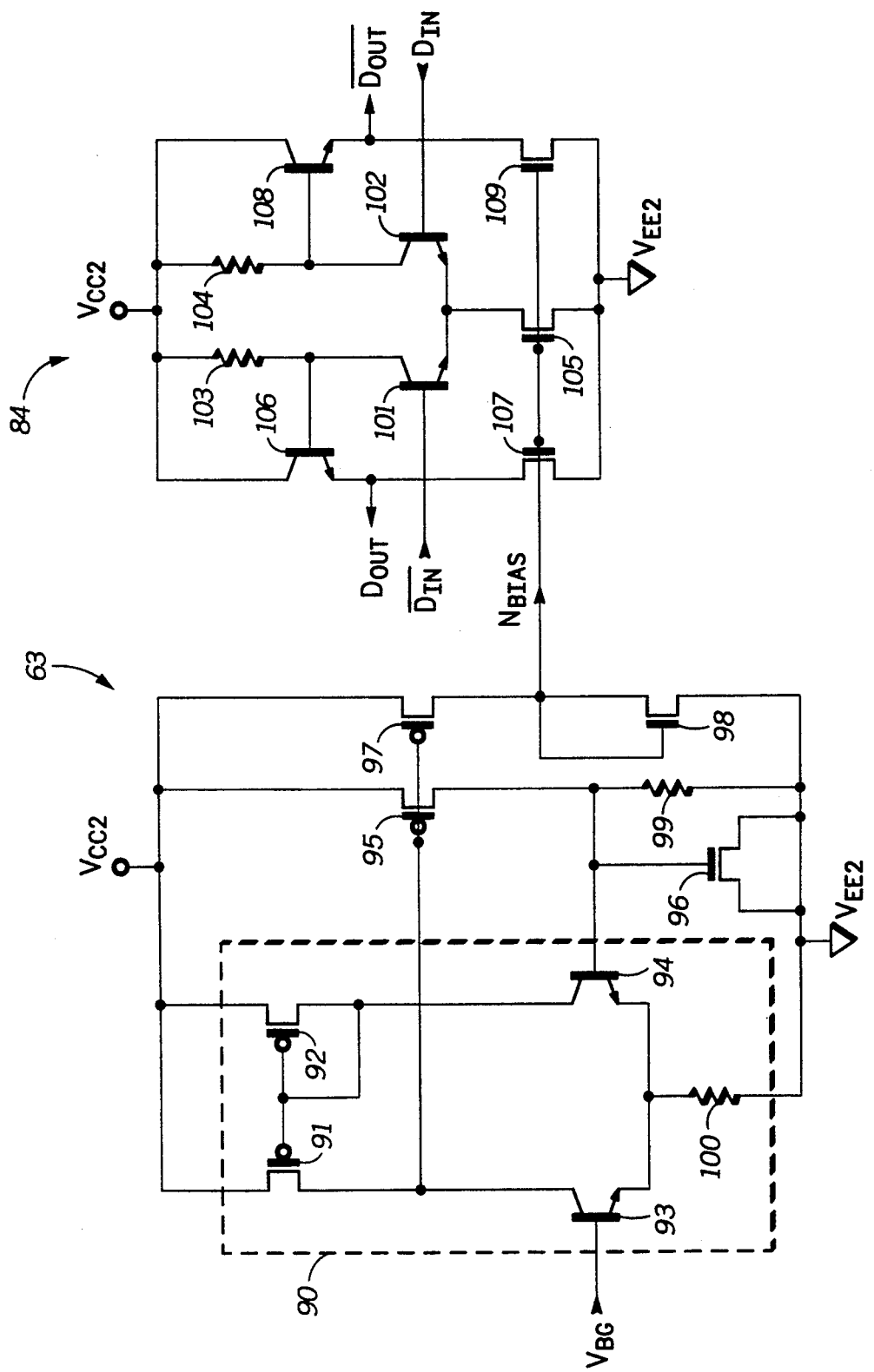
FIG. 3 illustrates in schematic diagram form the $N_{BIAS}$ generator and the amplifier circuit of FIG. 2.

FIG. 3 illustrates in schematic diagram form $N_{BIAS}$ generator 63 and amplifier circuit 84 of FIG. 2. $N_{BIAS}$ generators 63 and 73 have identical circuits, therefore, for purposes of illustration, only the operation of $N_{BIAS}$ generator 63 will be discussed. $N_{BIAS}$ generator 63 includes P-channel transistors 91, 92, 95, and 97, NPN transistors 93 and 94, N-channel transistors 96 and 98, and resistors 99 and 100. P-channel transistor 91 has a source connected to $V_{CC2}$, a gate, and a drain. P-channel transistor 92 has a source connected to $V_{CC2}$, a gate connected to the gate of transistor 91, and a drain connected to the gate of transistor 92. NPN transistor 93 has a collector connected to the drain of transistor 91, a base for receiving voltage $V_{BG}$, and an emitter. NPN transistor 94 has a collector connected to the drain of transistor 92, a base, and an emitter connected to the emitter of transistor 93. Resistor 100 has a first terminal connected to the emitter of transistor 93 and a second terminal connected to $V_{EE2}$. P-channel transistor 95 has a source connected to $V_{CC2}$, a gate connected to the drain of transistor 91, and a drain connected to the base of transistor 94. N-channel transistor 96 has a source and a drain connected to $V_{EE2}$, and a gate connected to the base of transistor 94. P-channel transistor 97 has a source connected to $V_{CC2}$, a gate connected to the drain of transistor 91, and a drain. N-channel transistor 98 has a drain connected to the drain of transistor 97 for providing $N_{BIAS}$, a source connected to $V_{EE2}$, and a gate connected to the drain of transistor 98.

Amplifier 84 is a conventional BICMOS amplifier circuit and includes NPN transistors 101, 102, 106, and 108, resistors 103 and 104, and N-channel transistors 105, 107, and 109. NPN transistor 101 has a collector, a base for receiving a signal labeled "$\overline{D_{IN}}$", and an emitter. NPN transistor 102 has a collector, a base for receiving a signal labeled "$D_{IN}$", and an emitter connected to the emitter of transistor 101. Resistor 103 has a first terminal connected to $V_{CC2}$ and a second terminal connected to the collector of transistor 101. Resistor 104 has a first terminal connected to $V_{CC2}$ and a second terminal connected to the collector of transistor 102. N-channel transistor 105 has source connected to $V_{EE2}$, a gate for receiving voltage $N_{BIAS}$, and a drain connected to the emitter of transistor 101. NPN transistor 106 has a collector connected to $V_{CC2}$, a base connected to the collector of transistor 101, and an emitter for providing a signal labeled "$D_{OUT}$". N-channel transistor 107 has a source connected to $V_{EE2}$, a drain connected to the emitter of transistor 106, and a gate for receiving voltage $N_{BIAS}$. NPN transistor 108 has a collector connected to $V_{CC2}$, an emitter for providing a signal labeled "$\overline{D_{OUT}}$", and a base connected to the collector of transistor 102. N-channel transistor 109 has a source connected to $V_{EE2}$, a drain connected to the emitter of transistor 108, and a gate for receiving voltage $N_{BIAS}$.

Figure 6:
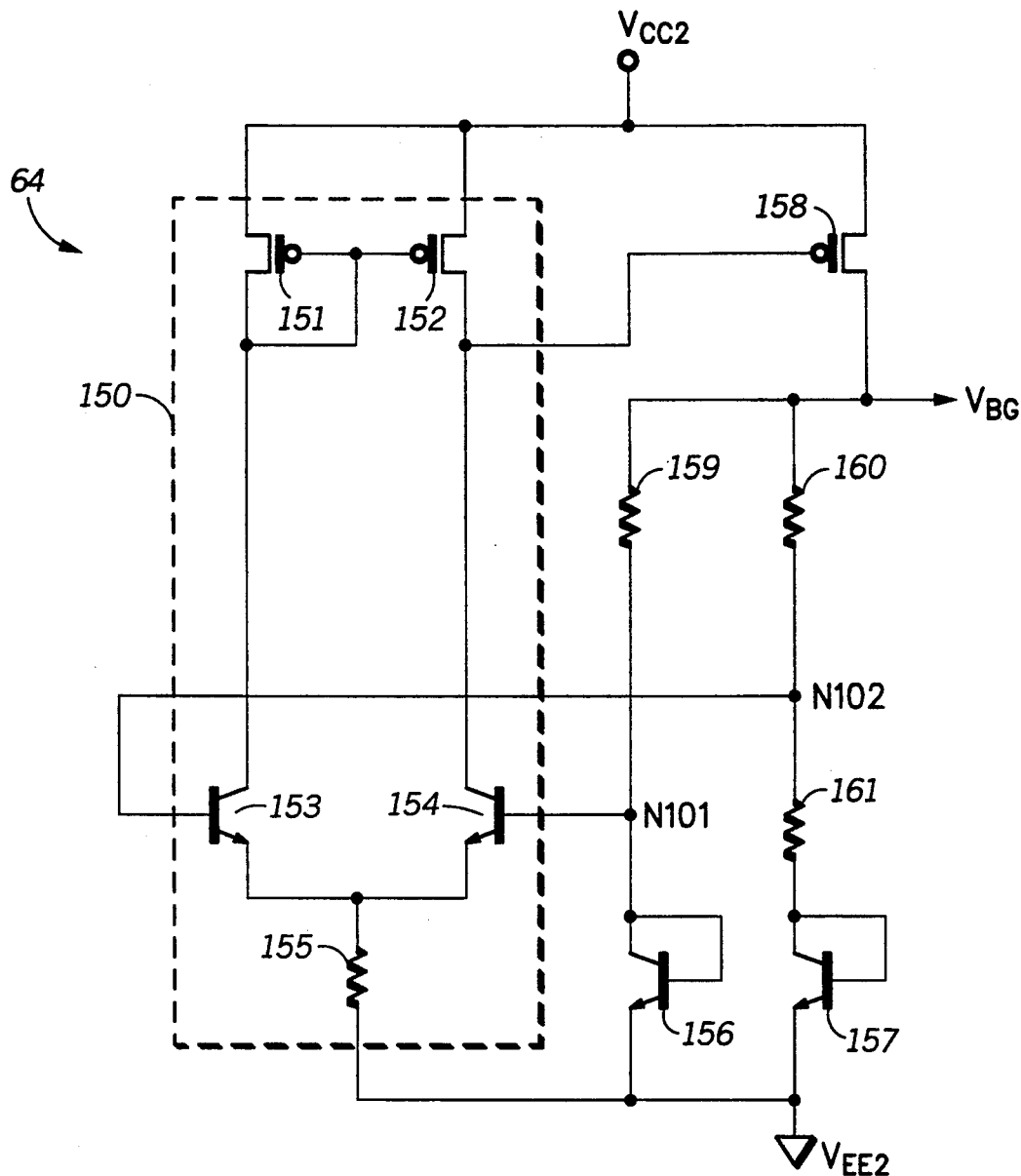
FIG. 6 illustrates in schematic form the $V_{BG}$ generator of FIG. 2.

A bandgap reference voltage ($V_{BG}$), provided by $V_{BG}$ generator 64 is received at the base of transistor 93. The circuit of $V_{BG}$ generator 64 is illustrated in FIG. 6 and will be discussed later. Transistors 91, 92, 93, and 94, and resistor 100 form an operational amplifier 90. Operational amplifier 90 adjusts the voltage at the drain of transistor 91 until the voltage at the base of transistor 94 is equal to bandgap voltage $V_{BG}$ received at the base of transistor 93. Transistor 96 serves as a capacitor to stabilize the voltage at the base of transistor 94. The gate-source voltage ($V_{GS}$) of transistors 95 and 97 are equal, so that transistors 95 and 97 are biased into saturation, thus making the current through resistor 99 relatively constant.

Transistor 98 forms a current mirror with each of transistors 105, 107, and 109 of amplifier 84. Therefore, it is important that the gate-source voltage, $V_{GS}$, of both transistors of the current mirror be the same. Power supply voltage $V_{EE2}$ will change depending on the demands placed upon $V_{EE}$ power supply conductor 62, but the $V_{GS}$ of transistors 98 and 107, for example, will be substantially equal because they are receiving substantially the same supply voltage. Locating $N_{BIAS}$ generator 63 as close as possible to amplifier 84 insures that their source voltages are approximately equal.

Amplifier 84 receives differential logic signal pair $D_{IN}$ and $\overline{D_{IN}}$ at the bases of transistors 101 and 102, respectively. If the voltage at the base of transistor 101 is more negative than the voltage at the base of transistor 102, which is the case if $\overline{D_{IN}}$ is a logic low, then the base-emitter voltage of transistor 101 is too low to support conduction and transistor 101 is essentially off (or non conductive) and transistor 102 is conductive. Transistor 105 receives $N_{BIAS}$ from $N_{BIAS}$ generator 63 and serves as a constant current source. A current designated "$I_{105}$", through transistor 105, will be steered through transistor 102. Thus, the voltage at the base of transistor 108 will be equal to $V_{CC2}$ minus $I_{105}R_{104}$ where $R_{104}$ is the resistance of resistor 104. The voltage at the base of transistor 106 will be equal to approximately $V_{CC2}$. If the voltage at the base of transistor 101 is less negative than the voltage at the base of transistor 102, which is the case if $\overline{D_{IN}}$ was a logic high, then transistor 101 will be conductive and transistor 102 will be non conductive. Current $I_{105}$ will be steered through transistor 101 and the voltage at the base of transistor 106 will be equal to $V_{CC2}$ minus $I_{105}R_{103}$ where $R_{103}$ is resistance of resistor 103. The voltage at the base of transistor 108 will be equal to approximately $V_{CC2}$.

Transistors 106 and 107 form an emitter-follower circuit where the signal $D_{OUT}$ at the emitter of transistor 106 is equal to the voltage at the base of transistor 106 minus one diode voltage drop. Transistors 108 and 109 also form an emitter-follower circuit where voltage $\overline{D_{OUT}}$ at the emitter of transistor 108 is equal to the voltage at the base of transistor 108 minus one diode voltage drop. Signals $D_{IN}$ and $\overline{D_{IN}}$ are received by output buffer 78, which provides a signal $Q_{OUT}$ to the base of transistor 80 of FIG. 2.

$N_{BIAS}$ generator 63 is located as close as possible to amplifiers 84 and 85 and address buffers 76 so that $N_{BIAS}$ generator 63 receives substantially the same power supply voltage as circuits to which $N_{BIAS}$ generator 63 is to supply bias voltage $N_{BIAS}$. Any noise on the power supply conductor is seen by $N_{BIAS}$ generator 63 as well as amplifiers 84 and 85 and address buffers 76. Locating $N_{BIAS}$ generator 63 as close as possible to amplifier 84 insures that the gate-source voltages of the current mirror of transistors 98, 105, 107, and 109 are substantially equal so that there is a constant current on both sides of the current mirror.

Figure 4:
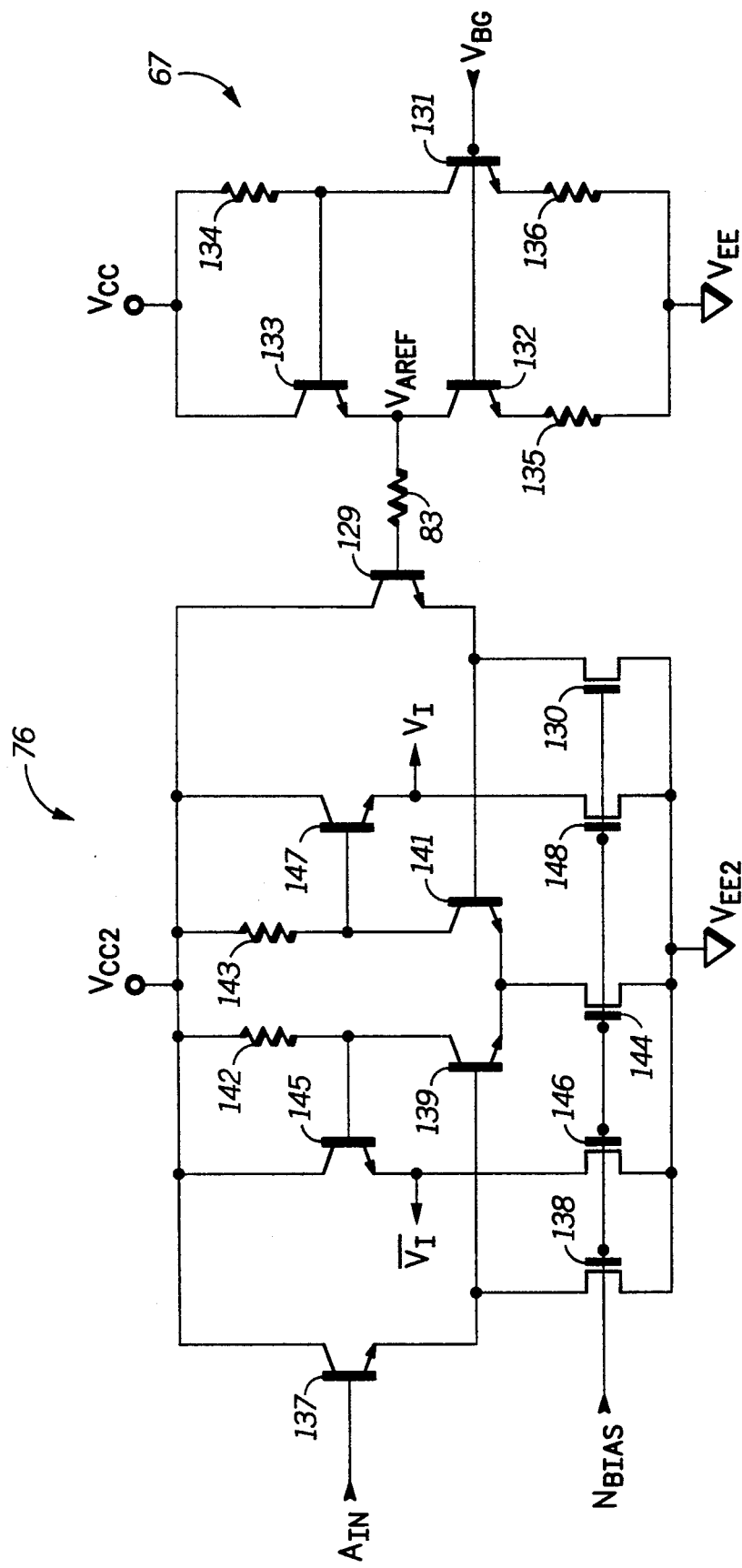
FIG. 4 illustrates in schematic form the $V_{AREF}$ generator and the address buffer of FIG. 2.

FIG. 4 illustrates in schematic form $V_{AREF}$ generator 67 and the address buffer 76 of FIG. 2. $V_{AREF}$ generator 67 includes NPN transistors 131, 132, and 133 and resistors 134, 135, and 136. NPN transistor 133 has a collector connected to $V_{CC}$, a base, and an emitter for providing voltage $V_{AREF}$. NPN transistor 132 has a collector connected to the emitter of transistor 133, a base for receiving voltage $V_{BG}$, and an emitter. Resistor 135 has a first terminal connected to the emitter of transistor 132 and a second terminal connected to $V_{EE}$. Resistor 136 has a first terminal and a second terminal connected to $V_{EE}$. NPN transistor 131 has a collector connected to the base of transistor 133, a base connected to the base of transistor 132 for receiving voltage $V_{BG}$, and an emitter connected to the first terminal of resistor 136. Resistor 134 has a first terminal connected to $V_{CC}$ and a second terminal connected to the collector of transistor 131.

Address buffer 76 is a conventional address buffer circuit and includes resistors 142 and 143, NPN transistors 129, 137, 139, 141, 145, and 147, and N-channel transistors 130, 138, 144, 146, and 148. NPN transistor 137 has a collector connected to $V_{CC2}$, a base for receiving a signal labeled "$A_{IN}$", and an emitter. N-channel transistor 138 has a drain connected to the emitter of transistor 137, a gate for receiving $N_{BIAS}$, and a source connected to $V_{EE2}$. NPN transistor 145 has a collector connected to $V_{CC2}$, a base, and an emitter for providing signal $\overline{V_J}$. N-channel transistor 146 has a drain connected to the emitter of transistor 145, a gate for receiving $N_{BIAS}$, and a source connected to $V_{EE2}$. Resistor 142 has a first terminal connected to $V_{CC2}$ and a second terminal connected to the base of transistor 145. Resistor 143 has a first terminal connected to $V_{CC2}$ and a second terminal. NPN transistor 139 has a collector connected to the second terminal of resistor 142, a base connected to the emitter of transistor 137, and an emitter. NPN transistor 141 has a collector connected to the second terminal of resistor 143, a base, and an emitter connected to the emitter of transistor 139. N-channel transistor 144 has a drain connected to the emitter of transistor 139, a gate for receiving voltage $N_{BIAS}$, and a source connected to $V_{EE2}$. NPN transistor 147 has a collector connected to $V_{CC2}$, a base connected to the second terminal of resistor 143, and an emitter for providing signal $V_J$. N-channel transistor 148 has a drain connected to the emitter of transistor 147, a gate for receiving voltage $N_{BIAS}$, and a source connected to $V_{EE2}$. NPN transistor 129 has a collector connected to $V_{CC2}$, a base, and an emitter connected to the base of transistor 141. N-channel transistor 130 has a drain connected to the emitter of transistor 129, a gate for receiving voltage $N_{BIAS}$, and a source connected to $V_{EE2}$.

$V_{AREF}$ generator 67 receives bandgap voltage $V_{BG}$ from $V_{BG}$ generator 66. The operation of $V_{BG}$ generator 66 will be considered later in the discussion of FIG. 6. A single $V_{AREF}$ generator 67 is used to supply reference voltage $V_{AREF}$ to address buffers 75 and 76. Reference voltage $V_{AREF}$ is approximately equal to $V_{CC} - V_{BG} \times R_{134}/R_{136}$, where $R_{134}$ represents the resistance of resistor 134 and $R_{136}$ represents the resistance of resistor 136. Since $V_{CC}$ and $V_{BG}$ are fixed, $V_{AREF}$ is determined by the ratio of $R_{134}$ to $R_{136}$. Increasing the resistance of $R_{136}$ will cause a decrease in the value of $V_{AREF}$. Determining the value of $V_{AREF}$ by using a ratio of resistances in this way is preferable since the actual values of $R_{134}$ and $R_{136}$ are not important. Resistor 135 acts as a load or current source for transistor 132.

Address buffer 76 receives reference voltage $V_{AREF}$ at the base of transistor 129. The parasitic resistance of the line between $V_{AREF}$ generator 67 and address buffer 76 is represented by resistor 83. The current through resistor 83 is very small, therefore the voltage drop across resistor 83 is very small, however the voltage drop across resistor 83 can easily be compensated for if desired by adjusting the $R_{134}/R_{136}$ ratio.

Address buffer 76 receives an external address signal $A_{IN}$ at ECL logic levels. $V_{AREF}$ is set at the midpoint of the address signal logic swing. Since $A_{IN}$ is an external logic signal, to ensure that $V_{AREF}$ is always at the midpoint of the logic swing of $A_{IN}$, $V_{AREF}$ generator 67 is located close to $V_{CC}$ bonding pad 23 and $V_{EE}$ bonding pad 25 for receiving a power supply voltage substantially equal to $V_{CC}$ and not subject to noise or voltage drops originating along the power supply voltage conductors.

Figure 5:
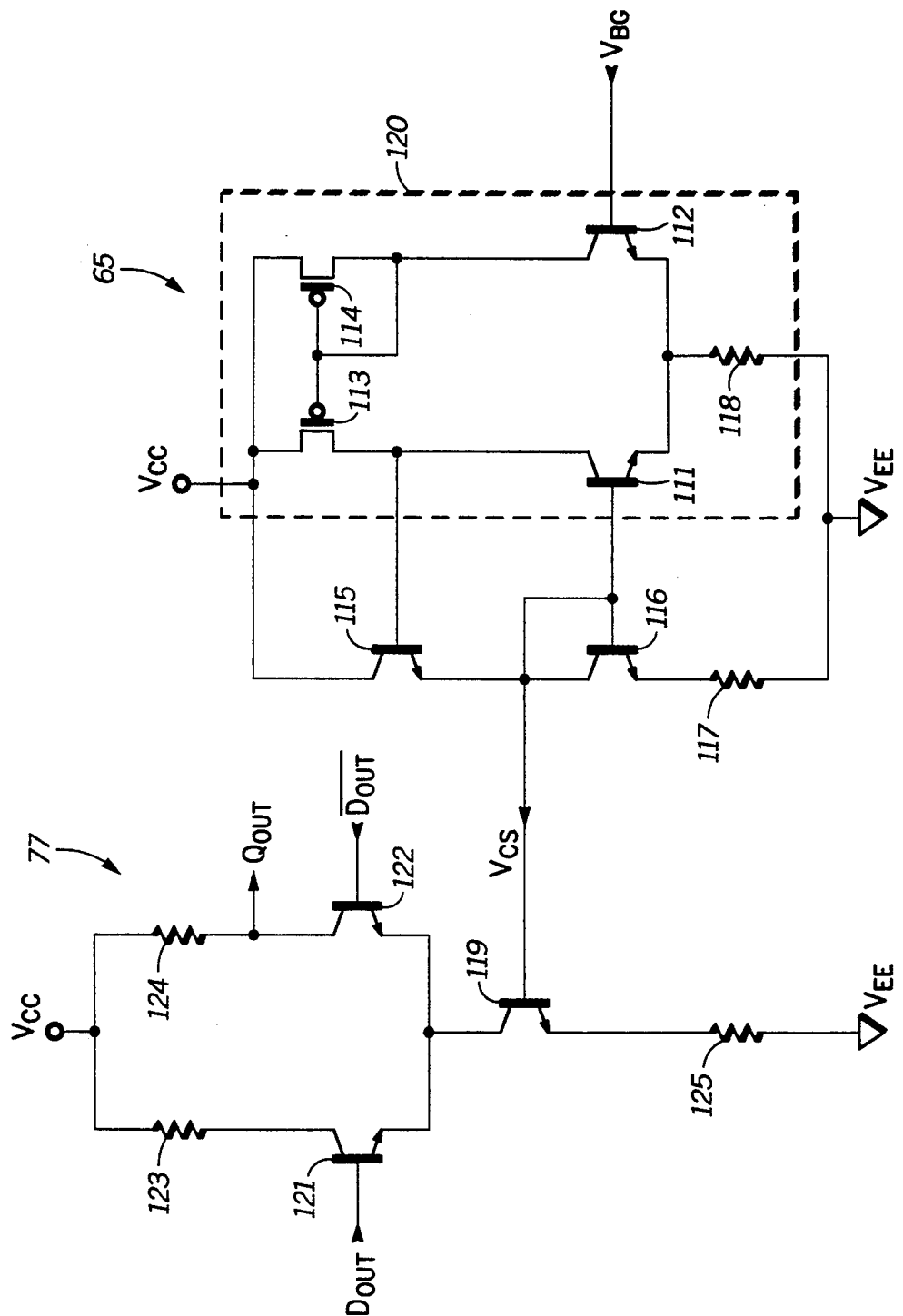
FIG. 5 illustrates in schematic diagram form the $V_{CS}$ generator and the data output buffer of FIG. 2.

FIG. 5 illustrates in schematic diagram form $V_{CS}$ generator 65 and data output buffer 77 of FIG. 2. $V_{CS}$ generator 65 includes P-channel transistors 113 and 114, NPN transistors 111, 112, 115, and 116, and resistors 117 and 118. Operational amplifier 120 is formed by transistors 111, 112, 113, and 114 and resistor 118. P-channel transistor 113 has a source connected to $V_{CC}$, a gate, and a drain. P-channel transistor 114 has a source connected to $V_{CC}$, a gate connected to the gate of transistor 113, and a drain connected to the gate of transistor 114. NPN transistor 115 has a collector connected to $V_{CC}$, a base connected to the drain of transistor 113, and an emitter for providing voltage $V_{CS}$. NPN transistor 116 has a collector connected to the emitter of transistor 115, a base connected to the collector of transistor 116, and an emitter. NPN transistor 111 has a collector connected to the drain of transistor 113, a base connected to the collector of transistor 116, and an emitter. NPN transistor 112 has a collector connected to the drain of transistor 114, a base for receiving voltage $V_{BG}$, and an emitter connected to the emitter of transistor 111. Resistor 117 has a first terminal connected to the emitter of transistor 116 and a second terminal connected to $V_{EE}$. Resistor 118 has a first terminal connected to the emitter of transistor 111 and a second terminal connected to $V_{EE}$.

Data output buffer 77 is a conventional data output buffer and includes NPN transistors 119, 121, and 122 and resistors 123, 124, and 125. Resistor 123 has a first terminal connected to $V_{CC}$ and a second terminal. NPN transistor 121 has a collector connected to the second terminal of transistor 123, a base for receiving signal $D_{OUT}$ from amplifier 85, and an emitter. NPN transistor 119 has a collector connected to the emitter of transistor 121, a base connected to the emitter of transistor 115 for receiving voltage $V_{CS}$ and an emitter. Resistor 125 has a first terminal connected to the emitter of transistor 119 and a second terminal connected to $V_{EE}$. NPN transistor 122 has a collector for providing signal $Q_{OUT}$, a base for receiving $\overline{D_{OUT}}$ from amplifier 85, and an emitter connected to the emitter of transistor 121. Resistor 124 has a first terminal connected to $V_{CC}$ and a second terminal connected to the collector of transistor 122.

$V_{BG}$ generator 66 provides bandgap voltage $V_{BG}$ to the base of transistor 112 of operational amplifier 120. The circuit of $V_{BG}$ generator 66 is the same as $V_{BG}$ generator 64, which is shown in FIG. 6 and will be discussed later. Operational amplifier 120 causes the voltage at the base of transistor 111 to be equal to $V_{BG}$, so that $V_{CS}$ will be equal to $V_{BG}$. Bias voltage $V_{CS}$ is provided to the base of transistor 119 which serves as a constant current source for output buffer 77. Transistor 115 is an active load and provides voltage $V_{CS}$ at its emitter. Locating both $V_{CS}$ generator 65 and output buffer 77 close to $V_{CC}$ bonding pad 23 improves the $V_{OH(min)}$ level by reducing the amount of internally generated power supply noise received by output buffer 77 and $V_{CS}$ generator 65 and also insures that signal $Q_{OUT}$ is substantially equal to $V_{CC}$.

FIG. 6 illustrates in schematic form $V_{BG}$ generator 64 of FIG. 2. $V_{BG}$ generator 64 includes P-channel transistor 151, 152, and 158, NPN transistors 153, 154, 156, and 157, and resistors 155, 159, 160, and 161. An operational amplifier portion 150 is formed by transistors 151–154 and resistor 155. P-channel transistor 151 has a source connected to $V_{CC2}$, a gate, and a drain connected to the gate of transistor 151. P-channel transistor 152 has a source connected to $V_{CC2}$, a gate connected to the drain of transistor 151, and a drain. NPN transistor 153 has a collector connected to the drain of transistor 151, a base, and an emitter. NPN transistor 154 has a collector connected to the drain of transistor 152, a base, and an emitter connected to the emitter of transistor 153. Resistor 155 has a first terminal connected to the emitter of transistor 153 and a second terminal connected to $V_{EE2}$. NPN transistor 156 has a collector connected to the base of transistor 154 at a node labeled "N101", a base connected to the collector of transistor 156 at node N101, and an emitter connected to $V_{EE2}$. NPN transistor 157 has a collector, a base connected to the collector of transistor 157, and an emitter connected to $V_{EE}$. Resistor 161 has a first terminal connected to the base of transistor 153 at a node labeled "N102" and a second terminal connected to the collector of transistor 157. Resistor 159 has a first terminal and a second terminal connected to the collector of transistor 156. Resistor 160 has a first terminal connected to the first terminal of resistor 159 and a second terminal connected to the first terminal of resistor 161 at node N102. P-channel transistor 158 has a source connected to $V_{CC2}$, a gate connected to the drain of transistor 152, and a drain connected to the first terminal of resistor 160 and for providing bias voltage $V_{BG}$. $V_{BG}$ generators 66 and 74 (illustrated in FIG. 2) are identical to $V_{BG}$ generator 64 except that $V_{BG}$ generator 66 receives power supply voltages $V_{CC}$ and $V_{EE}$ and $V_{BG}$ generator 74 receives power supply voltages $V_{CC1}$ at node 1 of $V_{CC}$ power supply conductor 61 and $V_{EE1}$ at node 3 of $V_{EE}$ power supply conductor 62.

$V_{BG}$ generator 64 must provide a continuous bandgap voltage $V_{BG}$ that remains stable with respect to temperature and manufacturing process variations. Bandgap voltage generators are known in the art and use the bandgap voltage of silicon to provide a regulated $V_{BG}$ reference voltage. Two scaled voltages having positive and negative temperature coefficients are added together to provide a relatively stable $V_{BG}$ independent of temperature changes. Transistors 156 and 157 are operated at different emitter current densities so that the voltage at node N101 is equal to the voltage at node N102. The negative temperature coefficient of transistor 156 is compensated for by matching it with the positive temperature coefficient of the voltage drop across resistor 159.

Distributed reference and bias voltage generators 60 provide the advantage that $N_{BIAS}$ generator 63 tracks the same power supply voltage that is provided to amplifiers 84 and 85 and to address buffer 76, to improve access time of memory 20. Output buffers 77 and 78, $V_{CS}$ generator 65, and $V_{BG}$ generator 66 are located close to $V_{EE}$ bonding pad 25 and $V_{CC}$ bonding pad 23 to reduce the amount of noise seen by output buffers 77 and 78, thereby improving the $V_{OH(min)}$ level. $V_{AREF}$ generator 67 is located near $V_{EE}$ bonding pad 25 and $V_{CC}$ bonding pad 23 so that it provides a reference voltage that is as close as possible to the midpoint of the logic swing of external signal $A_{IN}$.

While the invention has been described in the context of a preferred embodiment, it will be apparent to those skilled in the art that the present invention may be modified in numerous ways and may assume many embodiments other than that specifically set out and described above. For example, other types of reference and bias voltage circuits may be substituted for those illustrated. A $P_{BIAS}$ generator may be used instead of an $N_{BIAS}$ generator if a particular application called for $P_{BIAS}$ instead of $N_{BIAS}$. Accordingly, it is intended by the appended claims to cover all modifications of the invention which fall within the true spirit and scope of the invention.

We claim:

1. A memory having distributed reference and biasing voltages, comprising:
   a plurality of bonding pads located within a central portion along a first edge of the memory, for conducting positive and negative power supply voltages;
   a first bonding pad of said plurality of bonding pads for receiving an external positive power supply voltage;
   a positive power supply voltage conductor substantially parallel to said first edge having first and second ends and coupled to said first bonding pad;
   a second bonding pad of said plurality of bonding pads for receiving an external negative power supply voltage;
   a negative power supply voltage conductor substantially parallel to said first edge having first and second ends and coupled to said second bonding pad;

an amplifier coupled to said first end of each of said positive and negative power supply voltage conductors, for providing first and second output signals having logic levels determined by steering a predetermined current in response to first and second input signals;

said amplifier comprising:
- a first resistor having a first terminal connected to said first end of said positive power supply voltage conductors and a second terminal;
- a second resistor having a first terminal connected to said first end of said positive power supply voltage conductor and a second terminal;
- a first transistor having a collector connected to said second terminal of said first resistor, a base for receiving said first input signal, and an emitter;
- a second transistor having a collector connected to said second terminal of said second resistor, a base for receiving said second input signal and an emitter connected to said emitter of said first transistor;
- a third transistor having a drain connected to the emitters of said first and second transistors, a gate for receiving a bias voltage, and a source connected to said first end of said negative power supply voltage conductor;
- a fourth transistor having a collector connected to said first end of said positive power supply voltage conductor, a base connected to said collector of said first transistor, and an emitter for providing said first output signal;
- a fifth transistor having a drain connected to said emitter of said fourth transistor, a gate for receiving said bias voltage, and a source connected to said first end of said negative power supply voltage conductor;
- a sixth transistor having a collector connected to said first end of said positive power supply voltage conductor, a base connected to said collector of said second transistor, and an emitter for providing said second output signal; and
- a seventh transistor having a drain connected to said emitter of said sixth transistor, a gate for receiving said bias voltage, and a source connected to said negative power supply voltage conductor; and
- a bias voltage generator coupled to said first end of each of said positive and negative power supply voltage conductors and to said amplifier, for providing said bias voltage to said amplifier;

wherein said predetermined current is proportional to said bias voltage.

2. The memory of claim 1, further comprising a bandgap reference voltage generator coupled to said first end of each of said positive and negative power supply voltage conductors and to said bias voltage generator, for providing a bandgap reference voltage to said bias voltage generator.

3. The memory of claim 1, further comprising:
an input buffer circuit coupled to said first end of each of said positive and negative power supply voltage conductors for providing an internal signal at a logic state responsive to a difference between an input signal and a reference voltage; and a reference voltage generator coupled to each of said positive and negative power supply voltage conductors within said central portion, for providing said reference voltage.

4. The memory of claim 1, further comprising:
- a data output buffer circuit coupled to said positive and negative power supply voltage conductors in said central portion of the memory, for providing a data output signal having a logic level determined by steering a predetermined current in response to said first and second output signals; and
- a second bias voltage generator coupled to each of said positive and negative power supply voltage conductors within said central portion, for providing a second bias voltage to said data output buffer circuit.

5. The memory of claim 4, further comprising a third bias voltage generator coupled to said second end of each of said positive and negative power supply voltage conductors, for providing a third bias voltage.

6. A memory having distributed reference and biasing voltages, comprising:
- a plurality of bonding pads located within a central portion along a first edge of the memory, for conducting positive and negative power supply voltages;
- a first bonding pad of said plurality of bonding pads for receiving an external positive power supply voltage;
- a positive power supply voltage conductor substantially parallel to said first edge having first and second ends and coupled to said first bonding pad;
- a second bonding pad of said plurality of bonding pads for receiving an external negative power supply voltage;
- a negative power supply voltage conductor substantially parallel to said first edge having first and second ends and coupled to said second bonding pad;
- an input buffer circuit coupled to said first end of each of said positive and negative power supply voltage conductors, for providing an internal signal at a logic state responsive to a difference between an input signal and a reference voltage;
- a first bandgap reference voltage generator, coupled to said first end of each of said positive and negative power supply voltage conductors, for providing a first bandgap reference voltage;
- a bias voltage generator, coupled to said first end of each of said positive and negative power supply voltage conductors and to said amplifier, for receiving said first bandgap reference voltage and in response, providing a bias voltage to said input buffer circuit;
- a second bandgap reference voltage generator, coupled to said positive and negative power supply voltage conductors within said central portion, for providing a second bandgap reference voltage; and
- a reference voltage generator, coupled to each of said positive and negative power supply voltage conductors within said central portion, for receiving said second bandgap reference voltage and in response, providing said reference voltage.

7. The memory of claim 6, further comprising:
a data output buffer circuit coupled to said positive and negative power supply voltage conductors in said central portion of the memory, for providing a data output signal having a logic level determined by steering a predetermined current in response to first and second input signals; and a second bias voltage generator coupled to said first end of each of said positive and negative power supply voltage conductors within said central portion, for providing a second bias voltage to said data output buffer circuit.

8. The memory of claim 6, wherein said input buffer circuit comprises an emitter-follower input stage coupled to a differential amplifier and a first and second emitter-follower output stage coupled to said differential amplifier.

9. The memory of claim 6, wherein said reference voltage generator provides said reference voltage to a base of a bipolar transistor in a differential amplifier substantially at the midpoint of the logic swing of said internal signal.

10. The memory of claim 6, further comprising a second input buffer circuit coupled to said second end of each of said positive and negative power supply voltage conductors.

11. A memory having distributed reference and biasing voltages, comprising:

a plurality of bonding pads located within a central portion along a first edge of the memory, for conduction positive and negative power supply voltages;

a first bonding pad of said plurality of bonding pads for receiving an external positive power supply voltage;

a positive power supply voltage conductor substantially parallel to said first edge having first and second ends and coupled to said first bonding pad;

a second bonding pad of said plurality of bonding pads for receiving an external negative power supply voltage;

a negative power supply voltage conductor substantially parallel to said first edge having first and second ends and coupled to said second bonding pad;

a data output buffer circuit coupled to said positive and negative power supply voltage conductors in said central portion of the memory, for providing a data output signal having a logic level determined by steering a predetermined current in response to first and second input signals;

said data output buffer circuit comprising:

a first resistor having a first terminal connected to said positive power supply voltage conductors in said central portion of the memory and a second terminal;

a second resistor having a first terminal connected to said positive power supply voltage conductor in said central portion of the memory and a second terminal;

a first transistor having a collector connected to said second terminal of said first resistor, a base for receiving said first input signal, and an emitter;

a second transistor having a collector connected to said second terminal of said second resistor, a base for receiving said second input signal and an emitter connected to said emitter of said first transistor; and a third transistor having a collector connected to the connected emitters of said first and second transistors, a base for receiving a bias voltage, and an emitter connected to said negative power supply voltage conductor in said central portion of the memory; and a bias voltage generator coupled to each of said positive and negative power supply voltage conductors within said central portion, for providing said bias voltage;

wherein said predetermined current is proportional to said bias voltage.

12. The memory of claim 11, further comprising a bandgap reference voltage generator coupled to said positive and negative power supply voltage conductors within said central portion and to said bias voltage generator, for providing a bandgap reference voltage to said bias voltage generator.

13. The memory of claim 11, further comprising:

an input buffer circuit coupled to said first end of each of said positive and negative power supply voltage conductors for providing an internal signal at a logic state responsive to a difference between an input signal and a reference voltage; and a reference voltage generator coupled to each of said positive and negative power supply voltage conductors within said central portion, for providing said reference voltage.

14. A memory having distributed reference and biasing voltages, comprising:

first and second power supply conductors disposed substantially parallel to a first edge of the memory and having a parasitic resistance proportional to a length of said conductors, said first and second power supply conductors for receiving a first power supply voltage at a first node and providing a second power supply voltage at a second node substantially equal to said first power supply voltage minus a voltage drop due to said parasitic resistance;

a first bandgap reference voltage generator, coupled to said first and second power supply conductors at said second node, for receiving said second power supply voltage, and for providing a first bandgap reference voltage;

a bias voltage generator, coupled to said first and second power supply conductors at said second node, for receiving said second power supply voltage, and providing a bias voltage in response to receiving said first bandgap reference voltage; and an amplifier, coupled to said first and second power supply conductors at said second node, for receiving said second power supply voltage, and providing first and second output signals having logic levels determined by steering a predetermined current that is proportional to said bias voltage;

wherein said bias voltage generator and said first bandgap reference voltage generator are located close to said amplifier and receive substantially the same power supply voltages in order to ensure adequate noise immunity of said at least one amplifier.

15. The memory of claim 14, further comprising:

an input buffer circuit, coupled to said first and second power supply conductors at said second node, for receiving said second power supply voltage, said input buffer circuit providing an internal signal at a logic state responsive to a difference between an input signal and a reference voltage;

a second bandgap reference voltage generator, coupled to said first and second power supply conductors at said first node for receiving said first power supply voltage, and for providing a second bandgap reference voltage; and a reference voltage generator, coupled to said first and second power supply conductors at said first node, for receiving said first power supply voltage and said second bandgap reference voltage, and in response, providing said reference voltage substantially at a midpoint of a logic swing of said input signal.

16. The memory of claim 15, further comprising:

a second bias voltage generator, coupled to said first and second power supply conductors at said first node, for receiving said first power supply voltage and receiving said second bandgap reference voltage, and in response, providing a second bias voltage; and a data output buffer circuit, coupled to said first and second power supply conductors at said first node, for receiving said first power supply voltage, and a second bias voltage, and for providing a data output signal having a logic level determined by steering a predetermined current in response to first and second input signals.

* * * * *

UNITED STATES PATENT AND TRADEMARK OFFICE
CERTIFICATE OF CORRECTION

PATENT NO. : 5,291,455
DATED : March 1, 1994
INVENTOR(S) : Taisheng Feng et al.

It is certified that error appears in the above-indentified patent and that said Letters Patent is hereby corrected as shown below:

Column 14, Claim 14, Line 57,

Delete "at least one".

Signed and Sealed this

Twenty-third Day of August, 1994

Attest:

BRUCE LEHMAN

Attesting Officer        *Commissioner of Patents and Trademarks*